(12) United States Patent
Sakamoto

(10) Patent No.: US 6,320,247 B2
(45) Date of Patent: *Nov. 20, 2001

(54) UNIT TYPE CLIP LEAD TERMINAL, CLIP LEAD TERMINAL CONNECTING METHOD, LEAD TERMINAL CONNECTING BOARD, AND METHOD OF PRODUCING BOARD WITH LEAD TERMINALS

(75) Inventor: Akira Sakamoto, Tokyo (JP)

(73) Assignee: Oki Electric Industry Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/818,994

(22) Filed: Mar. 17, 1997

(30) Foreign Application Priority Data

Jul. 31, 1996 (JP) .................................................. 8-201643

(51) Int. Cl.[7] .......................... H01L 23/48; H01L 23/50; H05K 1/11
(52) U.S. Cl. .......................... 257/666; 257/698; 257/696; 257/724; 257/693; 257/692; 257/690; 257/775; 361/772; 361/776; 361/784; 174/52.4
(58) Field of Search .................................. 257/692, 666, 257/696, 724, 676, 786, 698, 693, 690, 775; 361/772, 774, 743, 760, 773, 784, 776, 823; 174/52.4, 260, 261, 266, 52.2

(56) References Cited

U.S. PATENT DOCUMENTS

| | | | |
|---|---|---|---|
| 4,257,668 | * 3/1981 | Ellis, Jr. ............................. | 339/258 R |
| 4,712,850 | 12/1987 | Seidler . | |
| 4,785,533 | * 11/1988 | Seino et al. ........................... | 257/668 |
| 4,855,866 | * 8/1989 | Imamura et al. ..................... | 361/306 |
| 4,949,225 | 8/1990 | Sagisaka . | |
| 4,985,742 | * 1/1991 | Utunomiya et al. .................. | 257/696 |
| 4,985,747 | * 1/1991 | Utunomiya et al. . | |
| 5,030,144 | 7/1991 | Seidler . | |
| 5,260,602 | * 11/1993 | Fukuba et al. ....................... | 257/712 |
| 5,386,085 | 1/1995 | Miehls . | |
| 5,398,166 | * 3/1995 | Yonezawa et al. .................. | 361/784 |
| 5,432,680 | * 7/1995 | Tsuchida et al. .................... | 361/776 |
| 5,650,665 | * 7/1997 | Yamamato et al. .................. | 257/773 |

FOREIGN PATENT DOCUMENTS

| | | | |
|---|---|---|---|
| 0 346 035 A | 12/1989 | (EP) . | |
| 0 492 492 | 7/1992 | (EP) . | |
| 0 6306194 | 1/1994 | (EP) . | |
| 2-129870 | 5/1990 | (JP) . | |
| 63-283051 | * 11/1988 | (JP) .................................. | 257/696 |
| 3-175660 | * 7/1991 | (JP) .................................. | 257/696 |
| WO 96/17413 | 6/1996 | (WO) . | |

* cited by examiner

Primary Examiner—Alexander Oscar Williams
(74) Attorney, Agent, or Firm—Venable; Robert J. Frank; James R. Burdett

(57) ABSTRACT

There is provided a technique of connecting easily the lead terminal to the board of the module. A plurality of clip lead terminals each has at one end thereof clip portions which are connected electrically to connecting terminals by sandwiching an end portion of a board of a module and the connecting terminals formed thereon between clip members of said clip portions and has a lead portion at the other end thereof. The clip lead terminals are arranged so as to be spaced from one another in parallel with one another with the leading edges of the respective clip portions aligned on a straight line. The clip lead terminals are connected to one another through a tie bar and a guide as a connecting portion, respectively, whereby the connecting clip lead terminal 18 is formed as one-body. The lead portions are bent on every other one, leading end portions of the bent lead portions and leading end portions of the non-bent lead portions are in parallel with each other viewing from a side of the board.

10 Claims, 10 Drawing Sheets

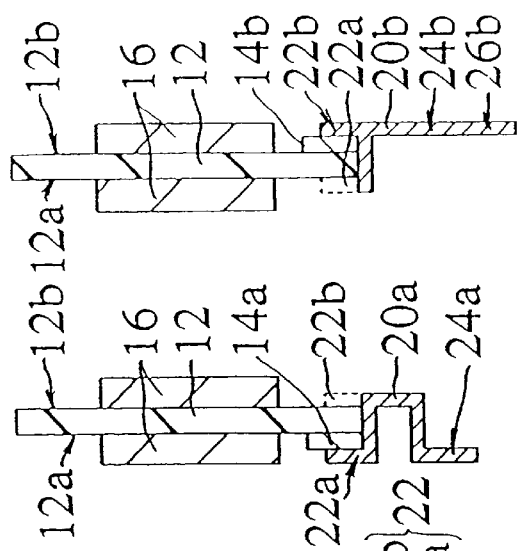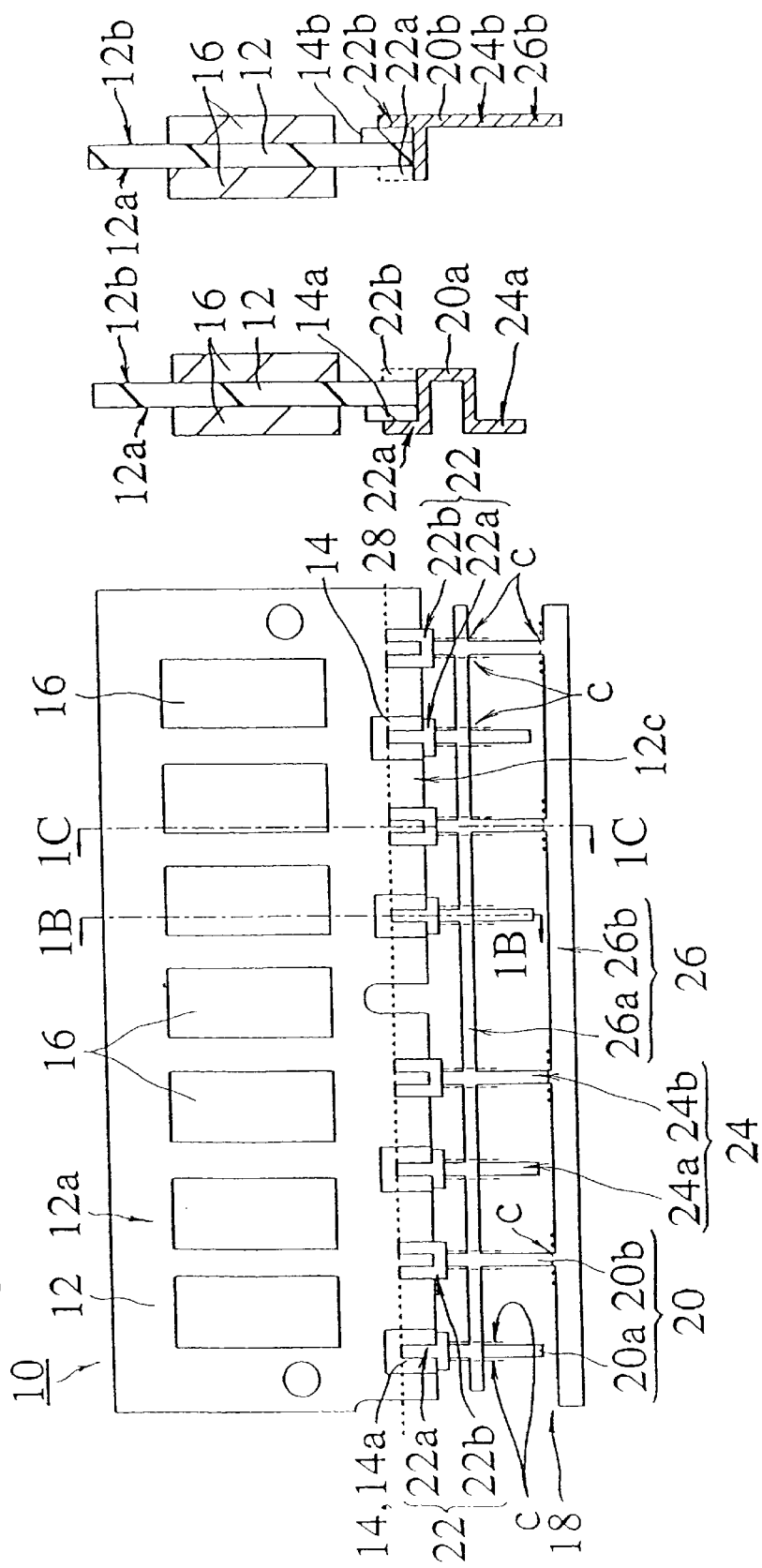

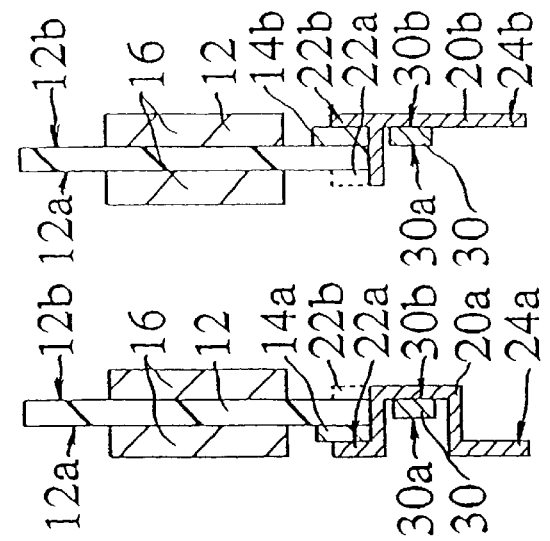
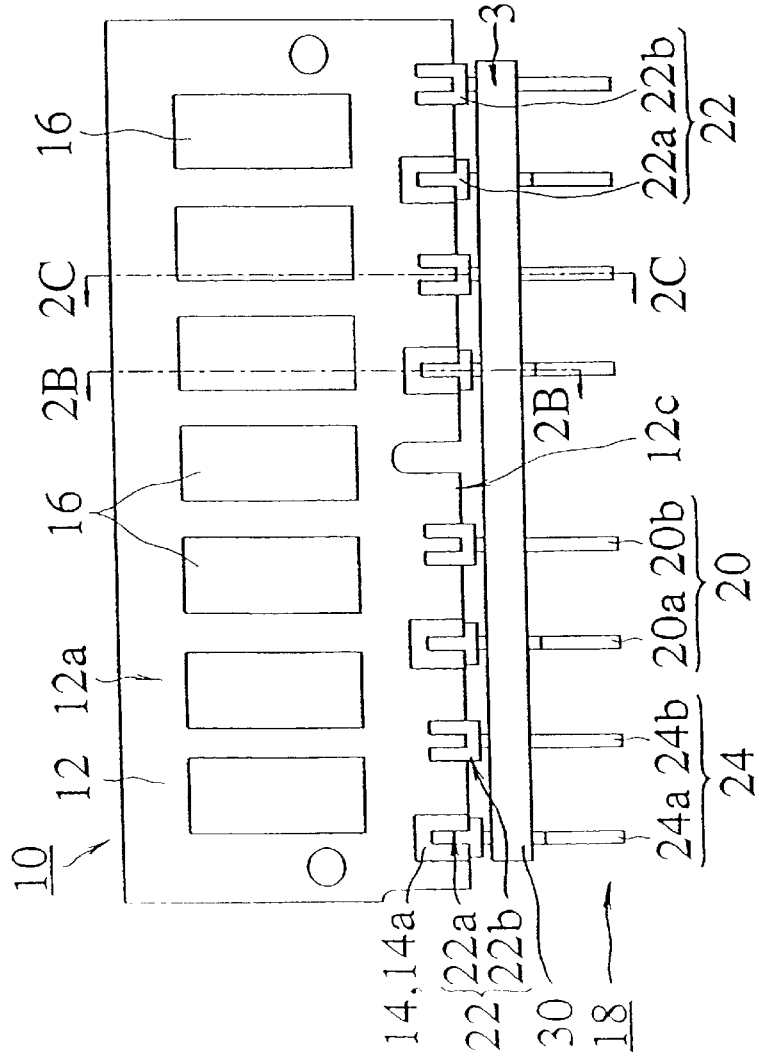

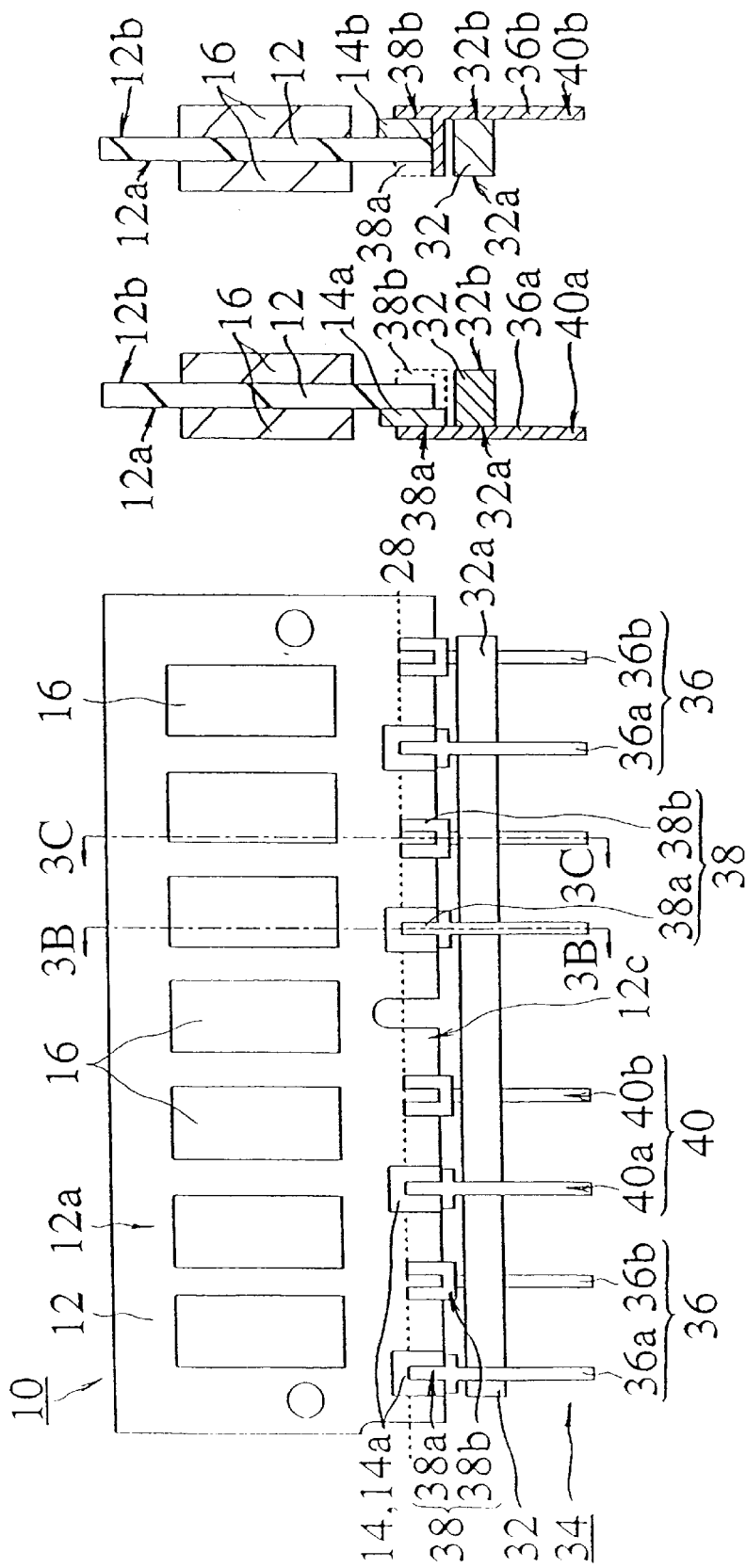

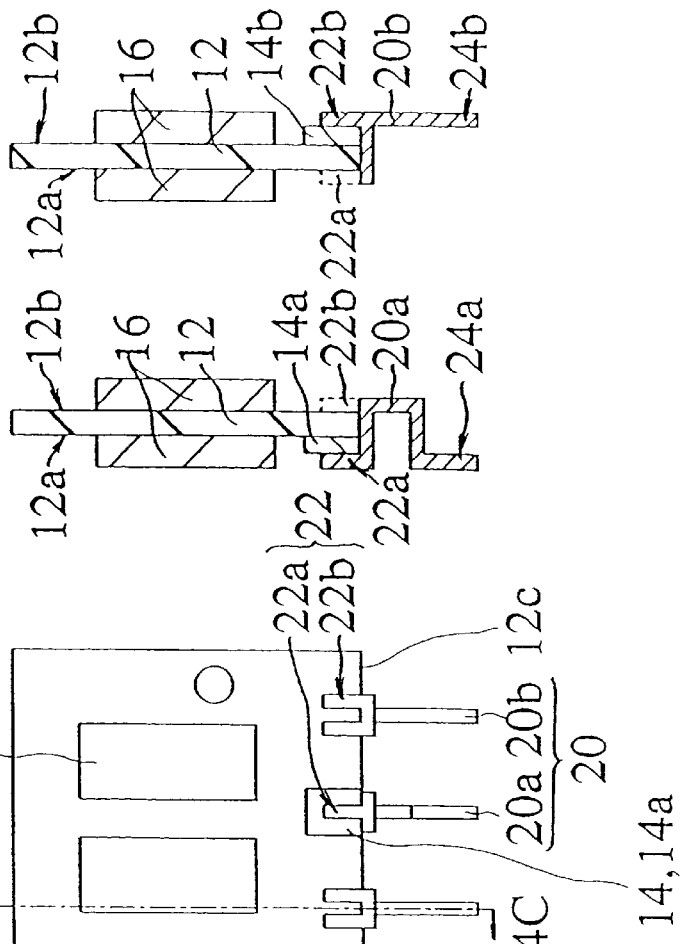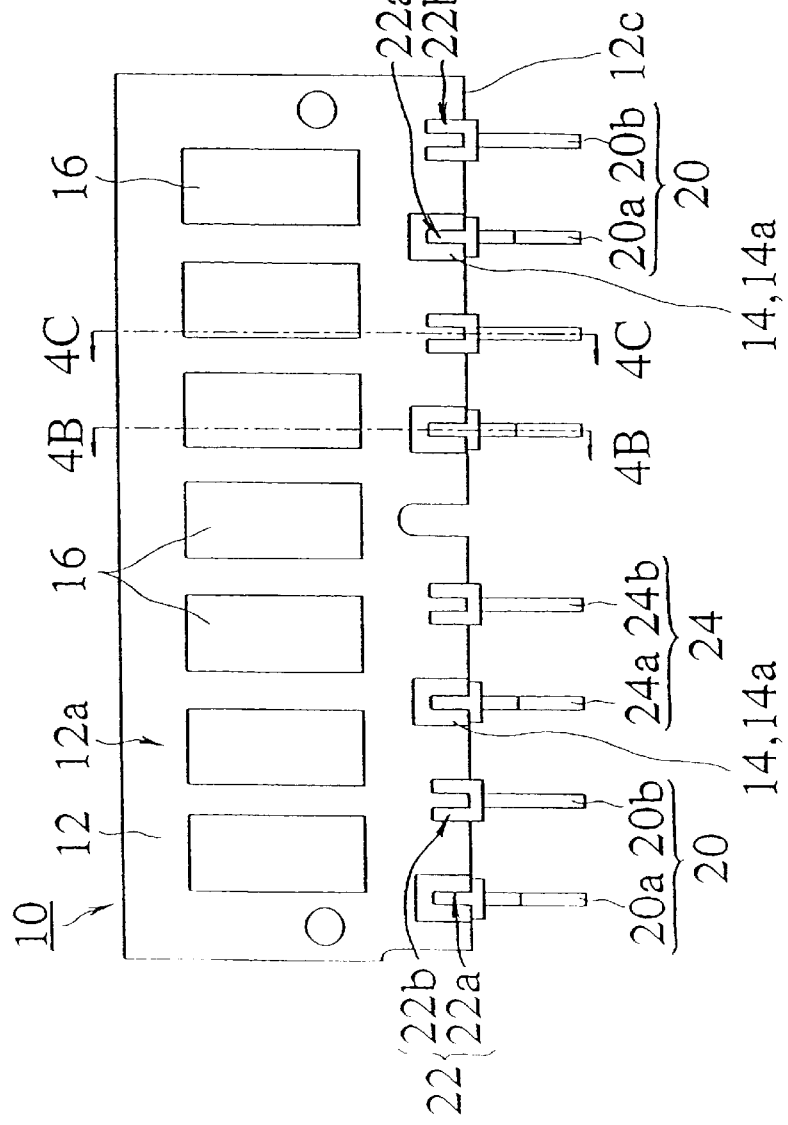

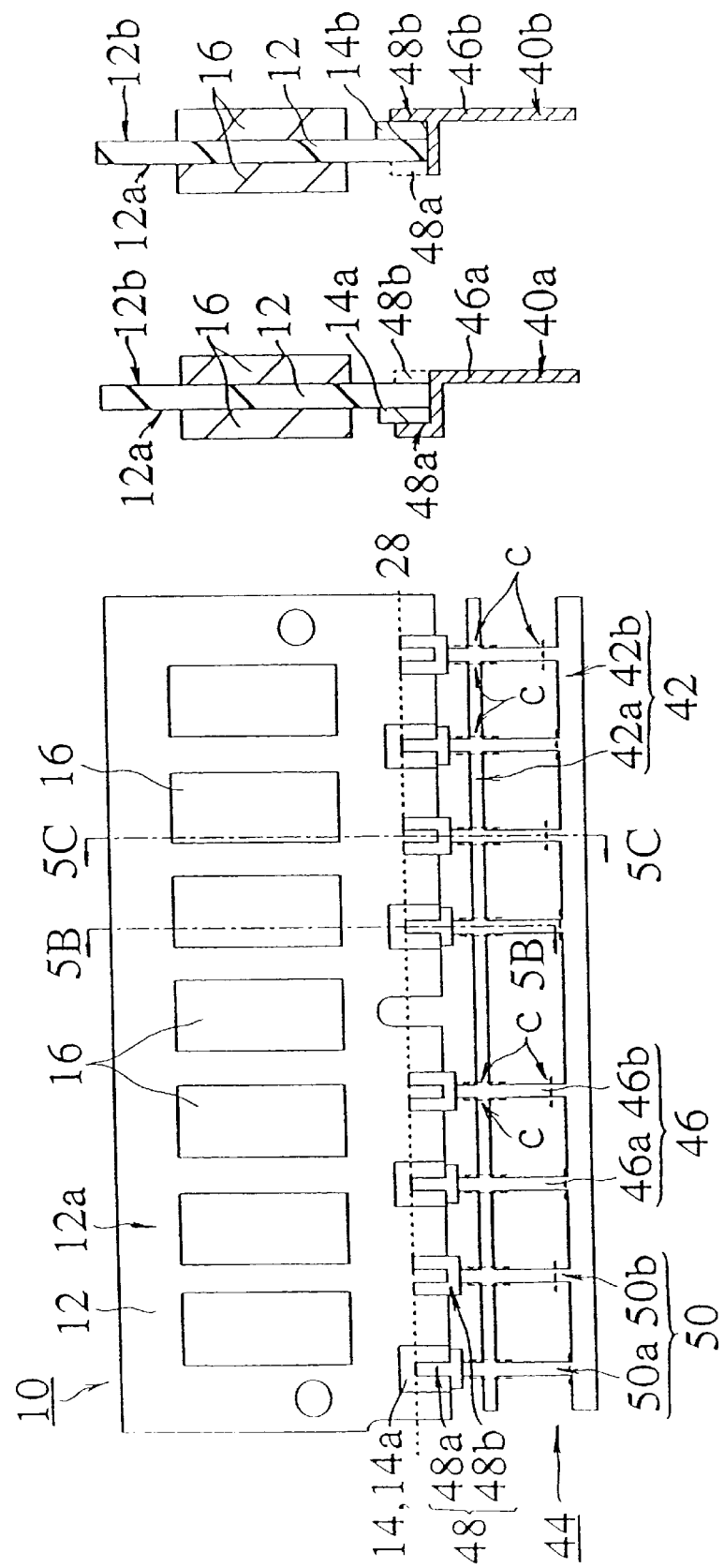

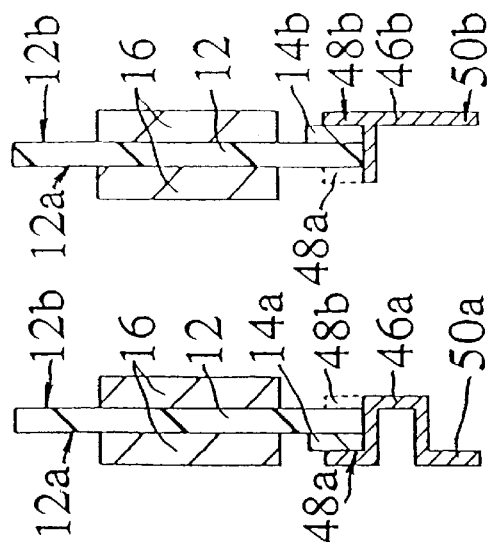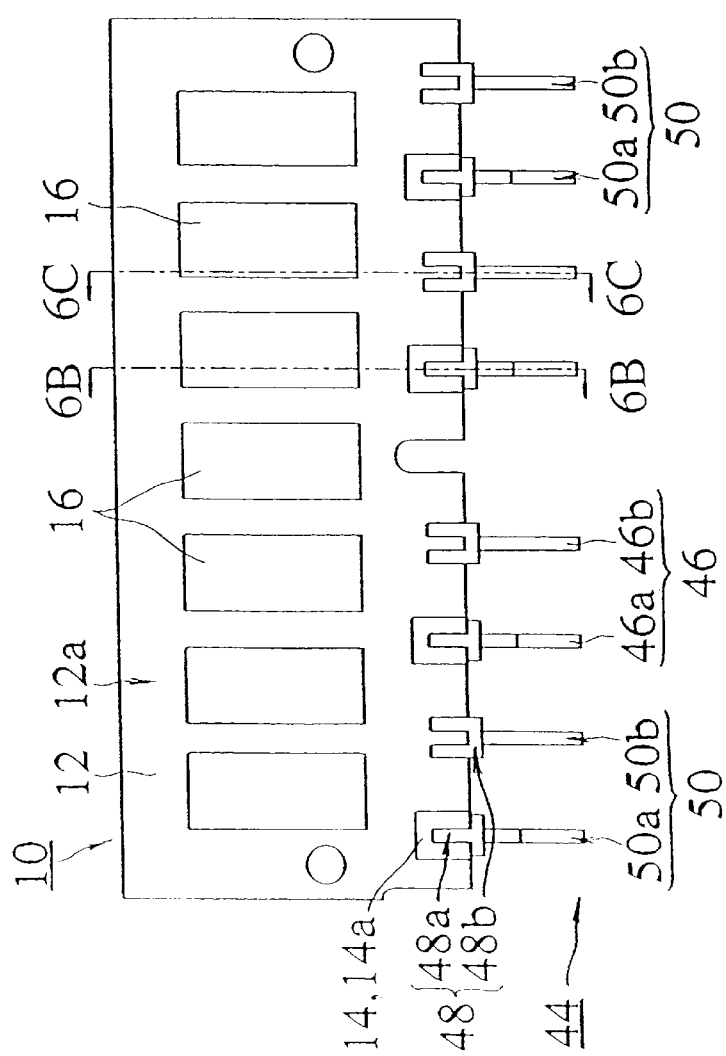

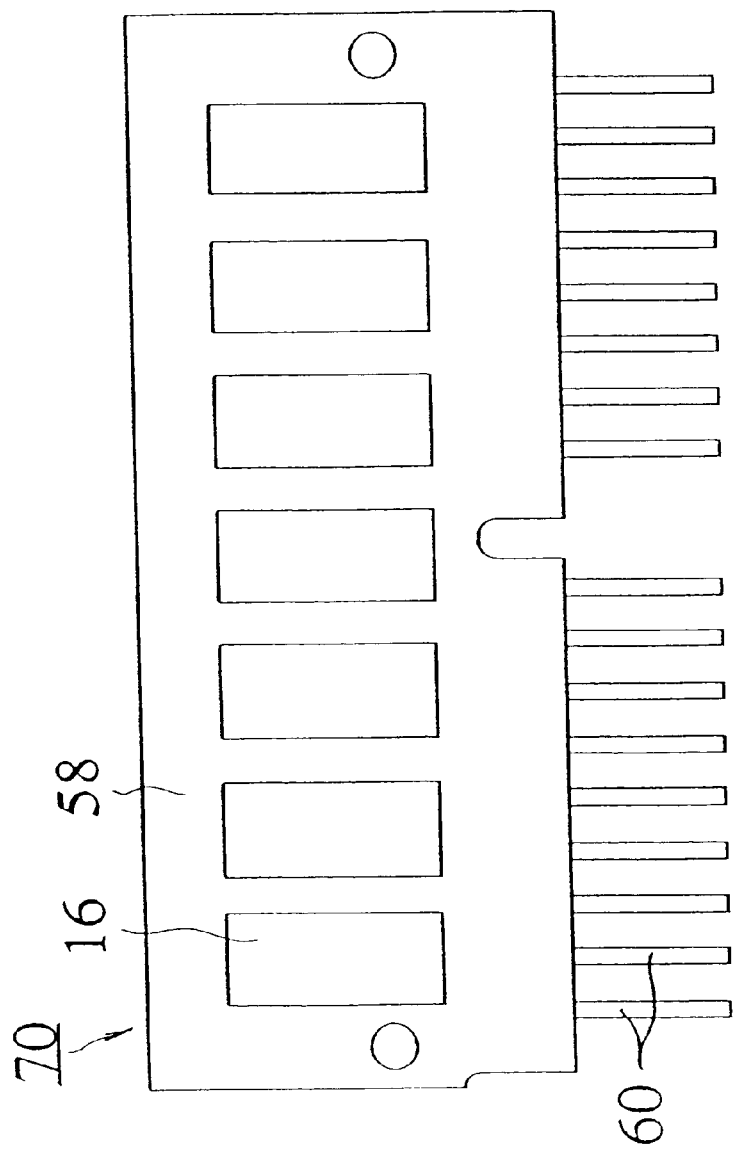

UNIT TYPE CLIP LEAD TERMINAL, CLIP LEAD TERMINAL CONNECTING METHOD, LEAD TERMINAL CONNECTING BOARD, AND METHOD OF PRODUCING BOARD WITH LEAD TERMINALS

BACKGROUND OF THE INVENTION

1. Field of the Invention

The present invention relates to a module in which semiconductor elements are mounted on a board, and more particularly to a unit type clip lead terminal comprising lead terminals for electrically connecting the module to an external device. The invention further relates to a clip lead terminal connecting method, a lead terminal connecting board, and a method of producing a board with lead terminals.

2. Description of the Related Art

Conventional clip lead terminal means to be connected to a board of a module is a unit type connecting clip lead terminal. This type of terminal means has a plurality of clip lead terminals aligned in the same direction and arranged in parallel with each other. The terminals are connected to each other through a tie bar and a guide member to thereby be united into one-body. Then, the unit type clip lead terminal is connected electrically to the board by sandwiching respective connecting terminals formed on an edge portion of the board by clip portions of the respective clip leads. The clip portion has usually a three-forked construction, then the center one portion and the both side two portions of the three forks sandwich the edge portion of the board on which the connecting terminals are disposed. After the clip portions have been connected thereto, the respective clip lead terminals are separated by removing the tie bars and the guide members, thereby obtaining the module with the clip lead terminals.

In the DIMM (Dual Inline Memory Module), connecting terminals formed on the front surface of the board and connecting terminals formed on the rear surface of the board are different with respect to signals outputted therefrom. The connecting terminals for the front surface and the connecting terminals for the rear surface are alternately disposed on the edge portion of the board of the DIMM in order to decrease the terminal pitch by narrowing the distance between the connecting terminals.

However, when the pitch between the connecting terminals is decreased, there is raised a fear that the clip portions of the adjacent clip lead terminals are short-circuited. Accordingly, in the DIMM, the clip lead terminals are constructed in such a manner that the adjacent clip portions are directed on the opposite sides, thereby preventing the adjacent clip portions from short-circuiting. That is, each of the clip portions is connected to the connecting terminal for the front surface and the connecting terminal for the rear surface of the board at the center one portion of the three forks thereof.

Also, in the DIMM, since the connecting terminal for the front surface and the connecting terminal for the rear surface board are different with respect to the signals outputted therefrom, the lead terminals are separated into two rows, one being connected to the connecting terminals for the front surface and the other connected to the connecting terminals for the rear surface.

Therefore, in a case where the clip lead terminals are connected to the DIMM, it is not appropriate to use the conventional unit type clip lead terminal used for the SIMM (Single Inline Memory Module), which is made narrow in pitch. Accordingly, as for a DIMM, there are prepared two unit type the clip lead terminals, one for the front surface and the other for the rear surface. Then, one of the two unit type clip lead terminals is separately connected to the connecting terminals for the front surface and the other to the connecting terminals for the rear surface of the DIMM.

However, since the two unit type clip lead terminals for the front surface and for the rear surface are separately connected to the DIMM, there is a problem that the manufacturing time for the connection is increased compared with a case where only one connecting clip lead terminal is connected to the SIMM.

It is therefore an object of the present invention to provide a technique of easily connecting lead terminals to a board of a module.

SUMMARY OF THE INVENTION

According to a first aspect of the invention, there is provided an unit type clip lead terminal comprising a plurality of clip lead terminals, each having at one end thereof clip portions for sandwiching an end portion of a board of a module and connecting terminals formed thereon between clip members of the clip portions, to thereby be electrically connected to the connecting terminals, and having a lead portion at the other end thereof. The clip lead terminals are arranged so as to be spaced apart from one another and in parallel with one another with leading edges of the respective clip portions aligned on a straight line, viewing from above the board. Every other lead portion being bent, leading end portions of the bent lead portions and leading end portions of the non-bent lead portions are in parallel with each other viewing from a side of the board. And the adjacent clip lead terminals are connected with each other through a connecting portion, whereby the respective clip lead terminals are united into one-body.

According to the above unit type clip lead terminal of the present invention, the clip lead terminal for the front surface terminal (hereinafter referred to as a "front clip lead terminal") and the clip lead terminal for the rear surface terminal (hereinafter referred to as a "rear clip lead terminal") are united into one-body, so that both the front clip lead terminals and the rear clip lead terminals can be connected to the board at one time by one operation. As a result, there can be shortened the time required for connecting the clip lead terminals to the DIMM. Accordingly, the clip lead terminals can be connected easily to the board of the module by using the unit type clip lead terminal according to the invention.

Also, in the unit type clip lead terminal according to the invention, the connecting portion can be made of an insulating tape. By thus using the insulating tape as the connecting portion, the connecting portions need not be cut off after the unit type clip lead terminal has been connected to the board.

According to a second aspect of the invention, there is provided an unit type clip lead terminal comprising a plurality of first clip lead terminals for first main surface connecting terminals, and a plurality of second clip lead terminals for second main surface connecting terminals. Each of the first clip lead terminals has at one end thereof clip portions to be electrically connected to the first main surface connecting terminal by sandwiching an end portion of a board of a module and the first main surface connecting terminals formed thereon between clip members of the clip portions. The first clip lead terminal has a lead portion at the other end thereof. Each of the second clip lead terminals has at one end thereof clip portions electrically connected to the second main surface connecting terminal by sandwiching the end portion of the board and the second main surface connecting terminals formed thereon between clip members of the clip portions. The second clip lead terminal has a lead portion at the other end thereof.

The first and second clip lead terminals are arranged so as to be spaced apart from one another and in parallel with one another with leading edges of the clip portions aligned on a straight line, viewing from above the board. The lead portions of the first clip lead terminals are bent, and then leading end portions of the lead portions of the first clip lead terminals and leading end portions of the lead portions of the second clip lead terminals are in parallel with each other viewing from a side of the board. The lead portions of the first clip lead terminals and the lead portions of the second clip lead terminals, which are adjacent to each other, are connected to each other through a connecting portion at overlapping portions thereof viewing from a side of the board, whereby the first clip lead terminals and the second clip lead terminals are united into one-body.

According to the unit type clip lead terminal of the invention, the first clip lead terminal for the front surface terminal (for the first main surface connecting terminal) and the second clip lead terminal for the rear surface terminal (for the second main surface connecting terminal) are united to thereby be formed into the unit type clip lead terminal, so that both the front clip lead terminals and the rear clip lead terminals can be connected to the board at one time by one operation. As a result, there can be shortened the time required for connecting the clip lead terminals to the DIMM. Accordingly, the clip lead terminals can be connected easily to the board of the module by using the unit type clip lead terminals according to the first aspect of the invention.

Also, in the unit type clip lead terminal according to the invention, the connecting portion may be made of an insulating tape. By thus using the insulating tape as the connecting portion, the connecting portions need not be cut off after connecting the unit type clip lead terminal to the board.

Further, according to a third aspect of the invention, there is provided an unit type clip lead terminal comprising a plurality of first clip lead terminals for first main surface connecting terminals and a plurality of second clip lead terminals for second main surface connecting terminals. Each of the first clip lead terminals has at one end thereof clip portions to be electrically connected to the first main surface connecting terminals by sandwiching an end portion of a board of a module, and the first main surface connecting terminals formed thereon between clip members of the clip portions. The first clip lead terminal has a lead portion at the other end thereof. Each of the second clip lead terminals has at one end thereof clip portions to be electrically connected to the second main surface connecting terminals by sandwiching the end portion of the board and the second main surface connecting terminal formed thereon between clip members of the clip portions. The second clip lead terminal has a lead portion at the other end thereof. The lead portions of the first and second clip lead terminals are alternately arranged so as to be spaced apart from one another in parallel with one another with leading edges of the clip portions aligned on a straight line. Each of the first clip lead terminals is fixed to a first main surface of a band-like insulating spacer having substantially the same thickness as the board, and each of the second clip lead terminals is fixed to a second main surface of the insulating spacer on the opposite side of the first main surface.

According to the unit type clip lead terminal of the invention, the front clip lead terminal and the rear clip lead terminal are previously united into one-body and then connected to the board, so that both the front and rear clip lead terminals can be connected to the board at one time by one operation. As a result, there can be shortened the time required for unit type the clip lead terminals to the DIMM. Accordingly, the clip lead terminals can be connected easily to the board of the module by using the unit type clip lead terminals according to the third aspect of the invention.

Furthermore, according to the unit type clip lead terminal of the invention, the connecting clip lead terminals are connected to one another through the insulating spacer. Accordingly, the connecting portions need not be cut off after the unit type clip lead terminal has been connected to the board. Also, the clip lead terminal for the front surface terminal and the clip lead terminal for the rear surface terminal are connected to the opposed main surfaces of the insulating spacer, respectively, whereby the lead portions of the clip lead terminals need not be bent.

According to a fourth aspect of the invention, there is provided a method of connecting clip lead terminals to a module, which method comprises the steps of:

preparing an unit type clip lead terminal wherein a plurality of clip lead terminals, each having at one end thereof clip portions for sandwiching an end portion of a board of a module and connecting terminals formed thereon between clip members of the clip portions to thereby be electrically connected to said connecting terminals, and having a leading portion at the other end thereof, are arranged so as to be spaced apart from one another in parallel with one another with leading edges of said clip portions aligned on a straight line, viewing from above said board, every other lead portion being bent, leading end portions of said bent lead portions and lead end portions of said non-bent portions are in parallel with each other viewing from a side of said board, and said adjacent clip lead terminals are connected with each other at overlapping portions thereof viewing from a side of said board through a connecting portion, whereby said respective clip lead terminals are united into one-body;

electrically connecting said respective clip portions with said connecting terminals by sandwiching said end portion of said board between the clip members of said respective clip portions, respectively; and separating said respective clip lead terminals by removing said connecting portion, after said connection.

According to the clip lead terminal connecting method of the invention, the clip lead terminal for the front surface terminal and the clip lead terminal for the rear surface terminal are previously united into one-body and then connected to the board, so that both the front and rear clip lead terminals can be connected to the board at one time by one operation. As a result, there can be shortened the time required for connecting the clip lead terminals to the DIMM. Accordingly, the clip lead terminals can be connected easily to the board of the module by using the clip lead terminal connecting methods of the fourth aspect of the invention.

According to a fifth aspect of the invention, there is provided a method of connecting clip lead terminals to a module, which method comprises the steps of:

preparing an unit type clip lead terminal wherein a plurality of clip lead terminals, each having at one end thereof clip portions for sandwiching an end portion of a board of a module and connecting terminals formed thereon between clip members of the clip portions to thereby be electrically connected to said connecting terminals, and having a lead portion at the other end thereof, are arranged so as to be spaced apart from one another in parallel with one another with leading edges of said clip portions aligned on a straight line, viewing from above said board, and said adjacent clip lead terminals are connected with each other through a connecting portion, whereby said respective clip lead terminals are united into one-body;

electrically connecting said respective clip portions with said connecting terminals by sandwiching said end portion by said respective clip portions, respectively;

separating said respective clip lead terminals by removing said connecting portion, after said connection; and bending said lead portions of said separated clip lead terminals every other one in such a manner that leading end portions of said bent lead portions and leading end portions of said non-bent lead portions are in parallel with each other viewing from a side of said board.

According to the clip lead terminal connecting method of a fifth aspect of the invention, the front and rear clip lead terminals are previously united into one-body and then connected to the board, so that both the front and rear clip lead terminals can be connected to the board at one time by one operation. As a result, there can be shortened the time required for connecting the clip lead terminals to the DIMM. Accordingly, the clip lead terminals can be connected easily to the board of the module by using the clip lead terminal connecting methods of the fifth aspect of the invention.

According to a sixth aspect of the invention, there is provided a lead terminal connecting board comprising a multi-layer body including an insulating core layer, intermediate layers laminated on and below the core layer, respectively, and insulating layers laminated outside each of the intermediate layers, respectively;

insertion holes, each of the intermediate layer being designed to receive a straight lead terminal through insertion holes formed in the intermediate layer; and the lead terminal, when the lead terminal is inserted into the insertion holes, being connected an electronic device mounted on the board through a hole penetrating through the prepreg layer and reaching the insertion hole.

According to the sixth aspect of the invention, the lead terminal connecting board has the insertion holes on the end surface of the board, so that there can be shortened the time required for connecting the clip lead terminals to DIMM. Accordingly, the clip lead terminals can be connected easily to the board of the module by using the clip lead terminal connecting board of the sixth aspect of the invention.

According to a seventh aspect of the invention, there is provided a method of producing a board with lead terminals, which method comprises:

laminating intermediate layers each having formed therein insertion holes in which lead terminals are inserted along the intermediate layer, on and below an insulating core layer;

inserting straight lead terminals into the insertion holes, respectively;

laminating insulating prepreg layers having formed therethrough via holes reaching the insertion hole outside the respective intermediate layers; and applying a pressure to a multi-layer body comprised of the core layer, the intermediate layers and the prepreg layers, from outside the prepreg layers, to compression-bond the core layer, the intermediate layers, the lead terminals and the prepreg layers.

According to the method of producing the board with the lead terminals of the seventh aspect of the invention, the multi-layer body in which the lead terminals are inserted into the insertion holes is subjected to the thermocompression bonding. Accordingly, the clip lead terminals can be connected easily to the board of the module by using the method of producing the board with the lead terminals of the invention.

The foregoing and other objects, features and advantages of the present invention will be better understood from the following description taken in connection with accompanying drawings.

BRIEF DESCRIPTION OF THE DRAWINGS

FIGS. 1A, 1B and 1C are schematic diagrams for explaining one embodiment of the invention, in which FIG. 1A is a plan view of an unit type clip lead terminal of a first embodiment according to the invention, FIG. 1B is a sectional view taken along the line 1B—1B FIG. 1A, and FIG. 1C is a sectional view taken along the line 1C—1C of FIG. 1A;

FIGS. 2A, 2B and 2C are schematic diagrams for explaining another embodiment of the invention, in which FIG. 2A is a plan view of an unit type clip lead terminal of a second embodiment according to the invention, FIG. 2B is a sectional view taken along the line 2B—2B of FIG. 2A, and FIG. 2C is a sectional view taken along the line 2C—2C of FIG. 2A;

FIGS. 3A, 3B and 3C are schematic drawings for explaining another embodiment of the present invention, in which FIG. 3A is a plan view of an unit type clip lead terminal of a third embodiment according to the invention, FIG. 3B is a sectional view taken along the line 3B—3B of FIG. 3A, and FIG. 3C is a sectional view taken along the line 3C—3C of FIG. 3A;

FIGS. 4A to 4C are explanatory views of a clip lead terminal connecting method of a fourth embodiment according to the invention, respectively. FIG. 4A is a sectional view taken along the line 4B of FIG. 4A and FIG. 4C is a sectional view taken along the line 4C of FIG. 4A FIGS. 5A to 5C are explanatory views of a clip lead terminal connecting method of a fifth embodiment according to the invention, respectively. FIG. 5A is a sectional view taken along the line 5B of FIG. 5A and FIG. 5C is sectional view taken along the line 5C of FIG. 5A FIGS. 6A to 6C are explanatory views of a clip lead terminal connecting method of a fifth embodiment according to the invention, respectively. FIG. 6A is a sectional view taken along the line 6B of FIG. 6A and FIG. 6C is a sectional view taken along the line 6C of FIG. 6A.

FIGS. 7A and 7B are schematic diagrams for explaining one embodiment of a lead terminal connecting board of the invention, in which FIG. 7A is a sectional view of the connecting clip lead terminal on a state where the lead terminals are not inserted into insertion holes yet, of a sixth embodiment according to the invention. FIG. 7B is a sectional view taken along the line 7B of FIG. 7A.

FIG. 9 is schematic diagrams for explaining one embodiment of the lead terminal connecting board of the invention, in which FIG. 9A is a plan view of the lead terminal connecting board on a state where lead terminals are inserted into the insertion holes, of a sixth embodiment according to the invention. FIG. 9B is a sectional view taken along the line I—I of FIG. 9A.

DETAILED DESCRIPTION OF THE PREFERRED EMBODIMENTS

Figure 7A:
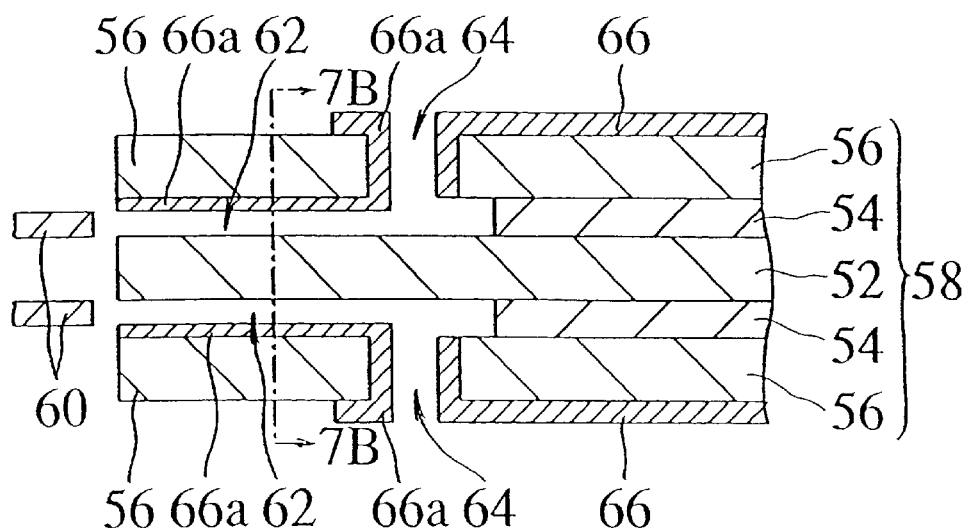

The inventions will now be described hereinbelow with reference to the drawings showing respective embodiments. Incidentally, the drawings to be referred show merely schematic arrangements of the respective constituent elements on such a level that the inventions can be understood. Accordingly, these inventions are not limited to the illustrated embodiments.

First Embodiment

A connecting clip lead terminal of a first embodiment according to the invention will be described with reference to FIGS. 1A, 1B, and 1C in which FIG. 1A is a plan view showing an unit type clip lead terminal of the first embodiment according to the invention, FIG. 1B is a sectional view taken along the line 1B—1B of FIG. 1A, and FIG. 1C is a sectional view taken along the line 1C—1C of FIG. 1A. Also, in FIG. 1B, a clip portion on a second main side (rear side) surface of a board is represented by a broken line, which is not a section thereof. Then, in FIG. 1C, a clip portion on a first main side (front side) surface of the board will be represented by a broken line, which is not a section thereof.

Further, FIG. 1A shows a state that connecting terminals 14 arranged on an end portion or a margin 12c of a board 12 of a DDIM type module 10 are sandwiched between clip members or clip elements of clip portions 22 of an unit type clip lead terminal 18. Front surface connecting terminals 14a and rear surface connecting terminals 14b as the connecting terminals 14 are formed alternately on the board 12. Semiconductor elements 16 (or IC chips and other electronic components) are provided onto the board 12.

The unit type clip lead terminal 18 according to this embodiment comprises a plurality of clip lead terminals 20. Each of the clip portions 22 has clip members or clip elements. The end portion or margin 12c of the board 12 of the module 10 and the connecting terminals 14 formed thereon are sandwiched between the clip members or clip elements. The clip lead terminals have at the other ends thereof a lead portion, respectively. The clip lead terminals 20 are arranged so as to be spaced from one another in parallel with one another with leading edges of the clip portions 22 aligned on a straight line 28. Each of the clip portions 22 is of a three forked construction, in which a center clip member and two side clip members of the three forks cooperate to sandwich between the center clip member and the side clip members the end portion 12c of the board 12 together with the connecting terminals 14 formed thereon. On this occasion, the adjacent clip portions 22 are directed to the opposite sides of the board 12, respectively, so as to prevent the adjacent clip portions 22 from short-circuiting, that is, the center clip member of the three forks of each of the clip portions 22 alternately contacts to the front surface connecting terminal 14a and the rear surface connecting terminal 14b on the board 12.

In FIG. 1A, the clip portions 22 corresponding to a plurality of first clip lead terminals 20a for first main surface connecting terminals (for front surface terminals) are called as front clip portions 22a and the clip portions 22 corresponding to a plurality of second clip lead terminals 20b for second main surface connecting terminals (for rear surface terminals) are called as rear clip portions 22b directed to opposite sides of the board 12, respectively. The center clip member of the first clip lead terminal 20a is connected to the front surface connecting terminal 14a. The clip portions 22 (22a and 22b) are fixed to the connecting terminals 14 (14a and 14b) by soldering.

Besides, the lead portions 24 of the clip lead terminals 20 are bent on every other one. In this instance, the lead portions 24 of the first clip lead terminals 20a are bent at four points thereof, thereby forming substantially "U"-like bent portion, respectively. Then, leading end portions of the bent lead portions 24a and leading end portions of the non-bent lead portions 24b are in parallel with each other viewing from a side of the board 12.

Furthermore, the unit type clip lead terminal 18 is of one-body construction in which the clip lead terminals 20 are connected to one another through tie bars 26a and a guide members 26b. The tie bar and the guide member are called as connecting portions 26, respectively. The first clip lead terminal 20a for the front surface terminal and the second clip lead terminal 20b for the rear surface terminal, which are adjacent to each other, are connected with each other at middle portions of the respective clip lead terminals through the tie bar 26a. In this embodiment, the tie bar 26a connects the clip lead terminals 20a and 20b with each other at the positions where the lead portions of both the clip lead terminals 20a and 20b are positioned on the same plane. Otherwise, the clip lead terminals 20a and 20b may be connected to each other at positions where the lead portions of both the clip lead terminals 20a and 20b are not positioned on the same plane. As described above, the connecting portion 26 is made of the same material as the clip lead terminals 20 and then formed continuously unitedly therewith.

The guide member 26b makes a connection between the adjacent second clip lead terminals 20b for the rear surface terminal to one another at leading ends of the lead portions 24b.

Furthermore, there is shown in FIG. 1B a section of the first clip lead terminal 20a for the first main surface connecting terminal (for the front surface terminal), and shown in FIG. 1C a section of the second clip lead terminal 20b for the second main surface connecting terminal (for the rear surface terminal). Also, these clip lead terminals 20 may be made of phosphor bronze similarly to the conventional lip lead terminal.

As described above, according to the unit type clip lead terminal of the first embodiment, the first clip lead terminals 20a for the front surface terminal and the second clip lead terminals 20b for the rear surface terminal are united into one-body to thereby obtain an unit type or connection type or coupled type construction. Accordingly, both the clip lead terminals 20a and 20b can be connected to the board 12 at one time by one operation, without separately connecting both the clip lead terminals 20a and 20b to the board 12. As a result, there can be shortened the time required for connecting the clip lead terminals to the DIMM. Accordingly, the clip lead terminals can be connected easily to the board of the module by using the unit type clip lead terminal according to the first embodiment.

Second Embodiment

An unit type clip lead terminal of a second embodiment according to the invention will be described with reference to FIGS. 2A, 2B and 2C in which FIG. 2A is a plan view showing the connecting clip lead terminal of the second embodiment according to the invention, FIG. 2B is a sectional view taken along the line 2B—2B of FIG. 2A, and FIG. 2C is a sectional view taken along the line 2C—2C of FIG. 2A.

The unit type clip lead terminal according to the second embodiment has the same construction as that of the first embodiment except that the connecting portion is formed of one insulating tape instead of the tie bars 26a and the guide members 26b used in the first embodiment. Accordingly, in FIGS. 2A, 2B and 2C the same reference numerals denote corresponding elements as those of FIGS. 1A, 1B and 1C, then the detail explanation thereof will be omitted.

In the unit type clip lead terminal 18 according to the second embodiment, the connecting portion is made of an insulating tape 30. This insulating tape 30 is provided over from one end side clip lead terminal to the other end side clip lead terminal in such a direction as to cross the respective clip lead terminals 20 arranged in parallel with one another. Also, this insulating tape 30 may be made of polyimide or Teflon which has an electrical insulation characteristic.

The insulating tape 30 is fixed to all the clip lead terminals 20 by an adhesive, at their middle portions where the lead portions 24a and 24b of both the clip lead terminals 20a and 20b are positioned on the same plane. The tape 30 contacts with the clip lead terminals 20 on a side of a second main surface 30b of the tape 30. Otherwise, the insulating tape 30 may connect both the clip lead terminals 20a and 20b at their positions where the lead portions of both the clip lead terminals 20a and 20b are not positioned on the same plane.

Then, the unit type clip lead terminal 18 fixed to the insulating tape 30 is supported by a flat plate, etc., and then connected to the board, whereby both the clip lead terminals 20a and 20b can be connected to the board 12 at one time by one operation. As a result, there can be shortened the time required for connecting the clip lead terminals to the DIMM. Accordingly, the clip lead terminals can be connected easily to the board of the module by using the unit type clip lead terminal according to the second embodiment.

Furthermore, by using the insulating tape 30 as the connecting portion, the clip lead terminals 20 are insulated with each other, the connecting portions 26 need not be cut off after connecting the unit type clip lead terminal 18 to the board 12.

Third Embodiment

An unit type clip lead terminal of a third embodiment according to the invention will be described with reference to FIGS. 3A, 3B and 3C in which FIG. 3A is a plan view showing the connecting clip lead terminal of the third embodiment according to the invention, FIG. 3B is a sectional view taken along the line 3B—3B of FIG. 3A, and FIG. 3C is a sectional view taken along the line 3C—3C of FIG. 3A.

The unit type clip lead terminals 34 according to the third embodiment is comprised of a plurality of first clip lead terminals 36a for first main surface connecting terminals (for front surface terminals) 14a, and a plurality of second clip lead terminals 36b for second main surface connecting terminals (for rear surface terminals) 14b. Then, the first clip lead terminal 36a has clip portions 38 at one end thereof, and a lead portion 40a at the other end thereof. The first clip lead terminal 36a is electrically connected to the front surface connecting terminal 14a. This connection is attained by sandwiching the end portion or margin 12c of the board 12 of the module 10 and the front surface connecting terminals (front surface terminals) 14a formed thereon, between the clip members of the clip portions 38.

Besides, the second clip lead terminal 36b has clip portions 38 at one end thereof, and a lead portion 40b at the other end thereof. The second clip lead terminal 36b is electrically connected to the second surface connecting terminals 14b. The connection is attained by sandwiching the end portion 12c of the board 12 of the module 10 and the second main surface connecting terminals (rear surface terminals) 14b formed thereon between the clip members of the clip portions 38.

The first clip lead terminals 36a for the first main surface connecting terminals (front surface terminals) 14a, and the second clip lead terminals 36b for second main front surface connecting terminals (rear surface terminals) 14b are arranged alternately so as to be spaced apart from one another and in parallel with one another with leading edges of the clip portions 38 aligned on the straight line 28.

The respective first clip lead terminals 36a are fixed by an adhesive at middle portions thereof to a first main surface 32a of a band-like insulating spacer 32, which has an electrical insulation characteristic, having substantially the same thickness as the board 12. The respective second clip lead terminals 36b are fixed by an adhesive at middle portions thereof to a second main surface 32b of the insulating spacer 32 on a rear side of the first main surface 32a.

Lead portions 40a of the first clip lead terminals 36a and lead portions 40b of the second clip lead terminals 36b are arranged in a vertical direction of the board and in parallel with one another as two rows viewing from a side of the board 12.

As described above, according to the unit type clip lead terminal of the third embodiment, the first clip lead terminals 36a and the second clip lead terminals 36b are connected to each other through an insulating spacer 32 to form an united, one-body construction. The construction may be also called a connection type or coupled type construction. Accordingly, both the clip lead terminals 36a and 36b can be connected to the board 12 at one time by one operation. As a result, there can be shortened the time required for connecting the clip lead terminals to the DIMM. Accordingly, the clip lead terminals can be connected easily to the board of the module by using the unit type clip lead terminal according to the third embodiment.

Furthermore, according to the unit type clip lead terminal of the third embodiment, the unit type clip lead terminals 36 are connected to one another through the insulating spacer 32. Accordingly, the connecting portion 32 need not be cut off after the unit type clip lead terminal 34 is connected to the board 12. Also, the first clip lead terminals 36a for the front surface terminals 14a and the second clip lead terminals 36b for the rear surface terminals 14b are connected to the opposed main surfaces of the insulating spacer 32, respectively, whereby the lead portion 40 of the clip lead terminal 36 need not be bent.

Fourth Embodiment

A clip lead terminal connecting method of a fourth embodiment according to the invention will be described with reference to FIGS. 1A, 1B and 1C and FIGS. 4A, 4B and 4C. FIG. 4A is an explanatory view of clip lead terminal connecting method of the fourth embodiment according to the invention, FIG. 4B is a sectional view taken along the line 4B—4B of FIG. 4A, and FIG. 4C is a sectional view taken along the line 4C—4C of FIG. 4A.

The unit type clip lead terminal 18, which has been described in the above first embodiment, is first prepared.

The clip lead terminals 20 and the connecting terminals 14 are electrically connected to one another by sandwiching the end portion and the connecting terminals 14 formed on the board 12 between clip members 22a and 22b of the clip portions 22.

Next, after the above connection, portions of the tie bars 26a and the guide members 26b as the connecting portions 26 are cut off by the use of the die, etc. The cut is done along the broken lines c in FIGS. 1A and 1C. Incidentally, in FIG. 1A, the broken lines c are illustrated so as to be shifted from the actual cut lines. Then, there are shown in FIGS. 4A to 4C a state in which the tie bars 26a and the guide members 26b are removed. FIG. 4B shows every other lead portion being bent.

As described above, according to the clip lead terminal connecting method of the fourth embodiment, the first clip lead terminals 20a for the front surface terminals and the second clip lead terminals 20b for the rear surface terminals are previously united as one-body through the connecting portions 26, so that both the clip lead terminals 20a and 20b can be connected to the board 12 at one time by one operation. As a result, there can be shortened the time required for connecting the clip lead terminals to the DIMM. Accordingly, the clip lead terminals can be connected easily to the board of the module by using the clip lead terminal connecting method according to the fourth embodiment.

Fifth Embodiment

Another clip lead terminal connecting method of a fifth embodiment according to the invention will be described with reference to FIGS. 5A, 5B and 5C, and FIGS. 6A, 6B and 6C, which are explanatory views of another clip lead connecting method of the fifth embodiment according to the invention. FIG. 5A is a plan view showing an unit type clip lead terminal in which the connecting portion is not cut yet, FIG. 5B is a sectional view taken along the line 5B—5B of FIG. 5A, and FIG. 5C is a sectional view taken along the line 5C—5C of FIG. 5A. FIG. 6A is a plan view showing a clip lead terminal in which the connecting portion has been cut, FIG. 6B is a sectional view taken along the line 6B—6B of FIG. 6A, and FIG. 6C is a sectional view taken along the line 6C—6C of FIG. 6A.

In the clip lead terminal connecting method according to the fifth embodiment, an unit type clip lead terminal 44 is first prepared. This unit type clip lead terminal 44 has a plurality of clip lead terminals 46. Each of the clip lead terminals 46 has clip portions 48 at one end thereof and a lead portion 50 at the other end thereof. This clip portions 48 are electrically connected to the connecting terminal 14 by sandwiching the end portion 12c of the board 12 of the module 10 and the connecting portions 14 formed on the end portion 12c between the clip members 48a and 48b of the portions 48. Further, each of the clip portions 48 is of a three-forked construction, in which a center clip member 48a and two side clip members 48b of the three forks sandwich therebetween the edge portion 12c of the board 12 and the connecting terminals 14 are provided thereon. In this instance, the adjacent clip portions 22 are directed to the opposite sides of the board 12, respectively, so as to prevent the adjacent clip portions 22 from short-circuiting.

The respective clip lead terminals 46 are arranged on the same plane so as to be spaced from one another and in parallel with one another with the leading edges of the clip portions 48 aligned on the straight line 28, viewing from above the board.

Moreover, the clip lead terminals 46 are connected to one another through tie bars 42a and guide members 42b as connecting portions 26, respectively, to thereby be united into one-body, thus forming a unit type or connection type or coupled type construction. The tie bar 42a connects the first clip lead terminal 46a for the front surface terminal and the second clip lead terminal 46b for the rear surface terminal at middle portions of the clip lead terminals.

Moreover, the guide member 42b connects both the adjacent clip lead terminals 46a and 46b at their lead portions 40. That is, the connecting portions 42 are made of the same material as the clip lead terminals 46 then formed continuously unitedly therewith.

Next, the clip lead terminals 46 and the connecting terminals 14 are connected electrically to each other by sandwiching the end portion 12 and the connecting terminals 14 formed thereon between the clip members 48a and 48b of the clip portions 48 (FIGS. 5A to 5C). The connecting terminals 14 of the board 12 are comprised of the front surface connecting terminals 14a and rear surface connecting terminals 14b, which are arranged alternately.

After the above connection, portions of the tie bars 26a and the guide members 26b as the connecting portions 26 are cut off by the use of the die, etc., then the respective clip lead terminals 46 are separated at least electrically. The cut is done along the broken lines c in FIGS. 5A to 5C. Incidentally, in FIG. 5A, the broken lines c are illustrated so as to be shifted from the actual lines.

Every other lead portion 50 of the clip lead terminals 46 are bent. In this instance, the lead portions 50a of the first clip lead terminals 46a are bent at four points locations thereof, thereby forming substantially "U"-like bent portion, respectively.

Besides, the lead portions 50a are bent, then the bent lead portions 50a and the non-bent lead portions 50b are made in parallel with each other as two rows viewing from a side of the board. Also, it is preferable that the respective leading ends of the lead portion 50a and the lead portion 50b are aligned on the same level (FIGS. 6A to 6C).

As described above, according to the clip lead terminal connecting method of the fifth embodiment, the first clip lead terminal 46a and the second clip lead terminal 46b are previously united as one-body through the connecting portion 42 then connected to the board 12, so that both the clip lead terminals 46a and 46b can be connected to the board 12 at one time by one operation. As a result, there can be shortened the time required for connecting the clip lead terminals to the DIMM. Accordingly, the clip lead terminal can be connected easily to the board of the module by using the clip lead terminal connecting method according to the fifth embodiment.

Sixth Embodiment

Figure 7B:
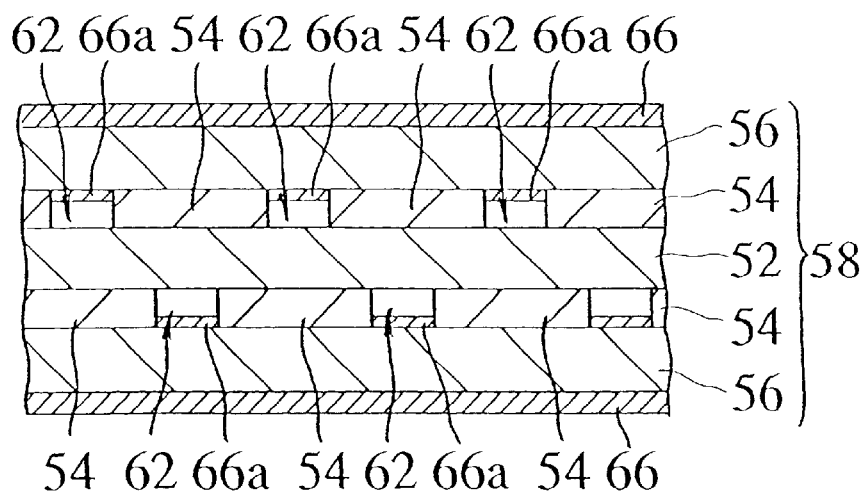

A lead terminal connecting board of a sixth embodiment according to the invention will be described with reference to FIGS. 7A, 7B, 8, 9A and 9B. FIG. 7A is a diagram showing cross section of a lead terminal connecting board with lead terminals not inserted into insertion holes yet, FIG. 7B is a diagram showing cross section taken along the line 7B of FIG. 7A.

Figure 8:
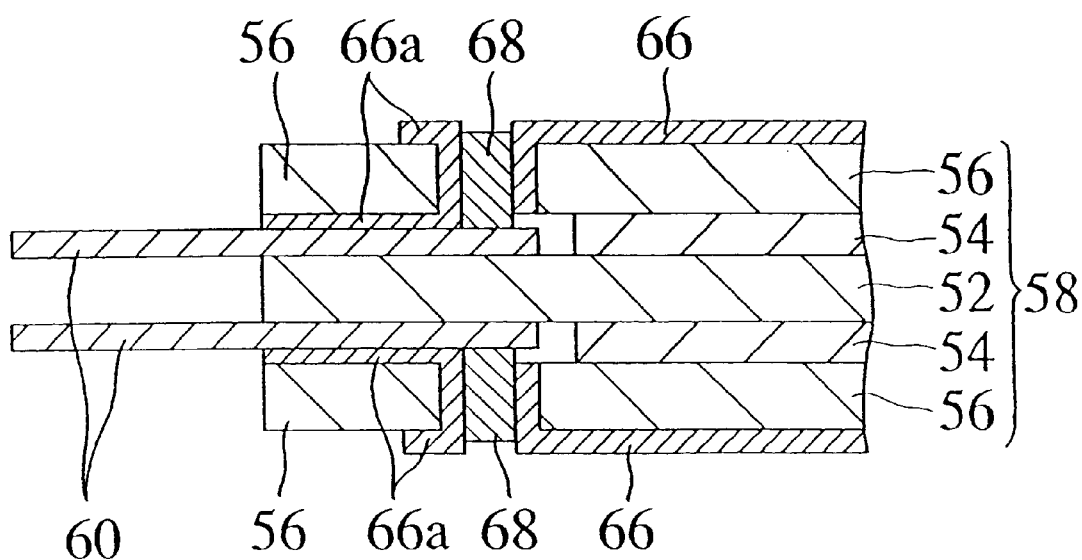
FIG. 8 is a sectional view of a lead terminal connecting board on a state where lead terminals are inserted into the insertion holes, of a sixth embodiment according to the invention.

FIG. 8 is a diagram showing cross section of a lead terminal connecting board on a state where lead terminals are inserted into insertion holes.

FIG. 9A is a plan view of the lead terminal connecting board on a state where the lead terminals are inserted into the insertion holes, and FIG. 9B is a side view of the lead terminal connecting board shown in FIG. 9A.

The clip lead terminal connecting board according to the sixth embodiment has a multi-layer body or a lamination or stacked layer body 58 which is comprised of an insulating core layer 52, intermediate layers made of a copper formed or laminated on and below the core layer 54, and insulating prepreg layers 56 formed or laminated outside each of the intermediate layer 54. The intermediate layer 54 has insertion holes 62 into each of which a lead terminal 60 is inserted. The prepreg layer 56 has a hole 64, being formed therethrough and reaching the insertion holes 62.

Further, in this embodiment, surface copper layers 66 are formed on surfaces of the prepreg layer 56. Also, in this embodiment, copper layers 66a are formed on the inner surfaces of the insertion holes 62 and the inner surfaces of the holes 64 in order to raise the reliability for the connection between the lead terminal 60 and the lamination layer body 58.

Furthermore, after the lead terminal 60 has been inserted into the insertion holes 62, a conductive adhesive 68 is filled in the via hole 64. The lead terminals 60 and the surface copper layers 66 are connected electrically through the conductive adhesive 68 and the copper layers 66a (FIG. 8A). Then, electronic components 16 of a module 70 shown in FIGS. 9A and 9B are connected electrically to the surface copper layer 66. The lead terminals 60 are shaped in a straight line and becomes thinner toward the leading end on an insertion side to form an offset nose. The offset nose structure prevents the lead terminal 60 from being excessively inserted into the insertion holes 62.

As described above, the lead terminal connecting board according to the sixth embodiment has the insertion holes 62 arranged in upper and lower rows on an end face of the board comprised of the lamination layer body 58. Therefore, due to the insertion of the lead terminals into the insertion holes 62, there can be shortened the time required for connecting the clip lead terminals to DIMM. Accordingly, the clip lead terminal can be connected easily to the board of the module by using the clip lead terminal connecting board according to the sixth embodiment.

Figure 10A:
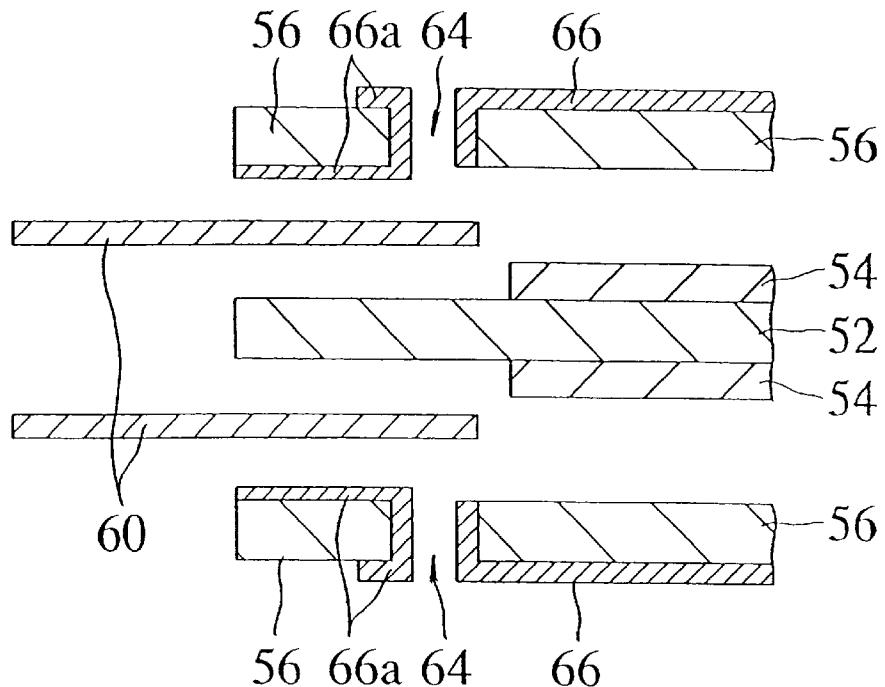
FIGS. 10A and 10B show process views of explaining a method of producing the board with lead terminals of the seventh embodiment according to the invention, respectively.
Figure 10B:
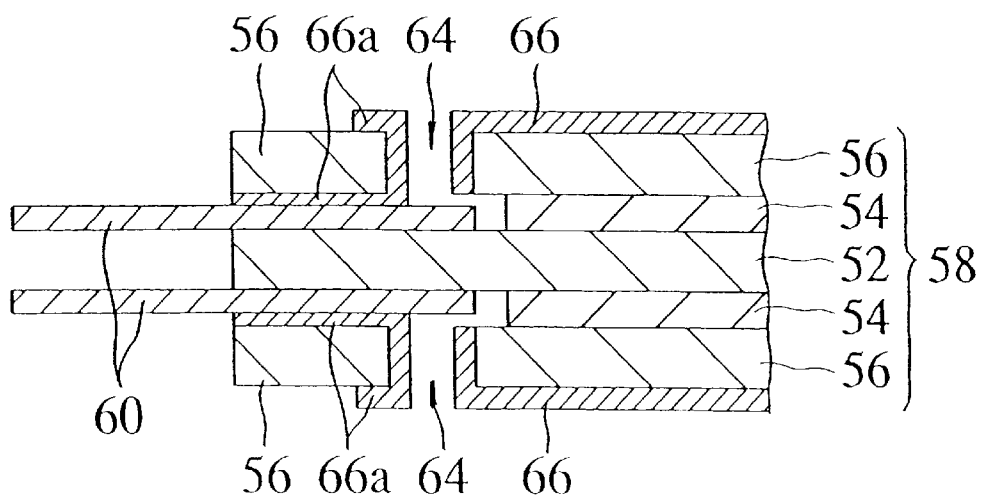

Seventh Embodiment Next, referring to FIGS. 10A and 10B, there is shown a method of producing the board with the lead terminals, of the seventh embodiment according to the seventh embodiment. FIGS. 10A and 10B show process views of a method of producing the board with the lead terminals according to the seventh embodiment.

In the method of producing the board with the clip lead terminals, according to the seventh embodiment, intermediate layers 54 having insertion holes 62 into which lead terminals 60 are inserted along the intermediate layers 54, are formed or laminated on and below an insulating core layer 52, respectively. Then, in this embodiment, copper layers 66a are formed on the inner surfaces of the insertion holes or recesses 62 in order to raise the reliability for the connection between the lead terminals 60 and the laminated layers 58.

Then, the lead terminals 60 are inserted into the insertion holes or recesses 62.

Prepreg layers 56 have formed therethrough holes 64 each penetrating through the prepreg layers 56 and reaching the insertion holes 62, respectively. The prepreg layers 56 are formed or laminated outside each of the intermediate layers 54. In this embodiment, the surface copper layers 66 are provided on the surfaces of the prepreg layers 56 and the inner surfaces of the holes 64.

Next, the pressure and heat are applied to the lamination layer body 58 constituted by the core layer 52, the intermediate layers 54 and the prepreg layers 56, from outside the prepreg layers 56 so as to attain the thermocompression-bonding therebetween. In this instance, the thermocompression-bonding is carried out by pressing, e.g. the soldering iron, the prepreg layer 56 under the temperature condition of about 180° C. or a temperature higher than 180° C. Due to this thermocompression bonding, there can be obtained the board with the lead terminal shown in FIGS. 9A and 9B.

In the above mentioned respective embodiments, the inventions have been described by the use of the embodiments of the specific materials and the specific conditions, however, these inventions can be much changed and modified. For example, in the above embodiments, the DIMM is used as the module, but these inventions can also be applied to the SIMM.

According to the first aspect and the second aspect of the invention, the first clip lead terminal for the front surface terminal (for the first main surface connecting terminal) and the second clip lead terminal for the rear surface terminal (for the second main surface connecting terminal) are united to form an unit type clip lead terminal, so that both the clip lead terminals for the front surface terminal and the clip lead terminals for the rear surface terminal can be connected to the board at one time by one operation. As a result, there can be shortened the time required for connecting the clip lead terminals to the DIMM. Accordingly, the clip lead terminals can be connected easily to the board of the module by using the unit type clip lead terminal according to present invention.

According to the unit type clip lead terminal of the present invention, since the insulating tape is used as the connecting portion, the connecting portions need not be cut off after the unit type clip lead terminal has been connected to the board.

According to the third aspect of the invention, the clip lead terminal for the front surface terminal (for the first main surface connecting terminal) and the clip lead terminal for the rear surface terminal (for the second main surface connecting terminal) are united to thereby obtain the unit type clip lead terminal, so that both the clip lead terminals for the front surface terminal and the clip lead terminals for the rear surface terminal can be connected to the board at one time by one operation. As a result, there can be shortened the time required for connecting the clip lead terminals to the DIMM. Accordingly, the clip lead terminals can be connected easily to the board of the module by using the unit type clip lead terminals according to the third aspect of the invention.

Furthermore, according to the unit type clip lead terminal of the invention, the clip lead terminals are connected to each other through an insulating spacer. Accordingly, the connecting portion need not be cut off after the unit type clip lead terminal has been connected to the board. Also, the clip lead terminal for the front surface terminal and the clip lead terminal for the rear surface terminal are connected to the opposed main surfaces of the insulating spacer, respectively, whereby the lead portions of the clip lead terminals need not be bent.

According the clip lead terminal connecting methods of the fourth aspect and the fifth aspect according to the invention, the clip lead terminal for the front surface terminal and the clip lead terminal for the rear surface terminal are previously united into one-body and then connected to the board, so that both the clip lead terminals for the front surface terminal and the clip lead terminals for the rear surface terminal can be connected to the board at one time by one operation. As a result, there can be shortened the time required for connecting the clip lead terminals to the DIMM. Accordingly, the clip lead terminals can be connected easily to the board of the module by using the clip lead terminal connecting methods of the fourth aspect and the fifth aspect of the invention.

According to the sixth aspect of the invention, the lead terminal connecting board has the insertion holes on the end surface of the board, so that there can be shortened the time required for connecting the clip lead terminals to the DIMM. Accordingly, the clip lead terminals can be connected easily to the board of the module by using the clip lead terminal connecting board of the sixth aspect of the invention.

According to the method of producing the board with lead terminals of the seventh aspect of the invention, the lamination layer body in which the lead terminals are inserted into the insertion holes is subjected to the thermocompression bonding, so that there can be shortened the time required for connecting the clip lead terminals to the DIMM. Accordingly, the clip lead terminals can be connected easily to the board of the module by using the method of producing the board with the lead terminals of the seventh aspect of the invention.

Many widely different embodiments of the invention may be constructed without departing from the spirit and scope of the invention. It should be understood that the invention is not limited to the specific embodiments described in the specification, except as defined in the appended claims.

What is claimed is:

1. A unit type clip lead terminal, comprising:

a plurality of first clip lead terminals which contacts first main surface connecting terminals, each having at one end thereof clip portions to be electrically connected to said first main surface connecting terminal by sandwiching an end portion of a board of a module and said first main surface connecting terminals formed thereon between three-branched clip members of said clip portions, and having a lead portion at the other end thereof;

wherein the board has a first main surface and a second main surface opposite the first main surface and wherein said first main surface connecting terminals are formed on said first main surface;

a plurality of second clip lead terminals which contacts second main surface connecting terminals, each having at one end thereof clip portions to be electrically connected to said second main surface connecting terminal by sandwiching an end portion of said board and said second main surface connecting terminals formed thereon between three-branched clip members of said clip portions, and having a lead portion at the other end thereof;

wherein said second main surface connecting terminals are formed on the second main surface;

said first and second clip lead terminals being alternately arranged along the board so as to be spaced apart from one another and in parallel with one another with leading edges of respective said clip portions aligned on a straight line, viewing from above said board;

said lead portions of said first clip lead terminals being bent;

leading end portions of said lead portions of said first clip lead terminals and leading end portions of said second clip lead terminals being in parallel with each other viewing from a side of said board; and said lead portions of said first clip lead terminals and said lead portions of said second clip lead terminals, which are adjacent to each other, being connected to each other through a connecting portion at overlapping portions thereof viewing from a side of said board, to thereby unite said first clip lead terminals and said second clip lead terminals into one-body, wherein said three-branched clip members of said first and second clip lead terminals comprise first, second and third clip members spaced in parallel with one another, said second clip member being located between said first and third clip members, said second clip member of said first clip lead terminal and contacts to said first main surface of said board of said module, and said first and third clip members contacting to said second main surface of said board of said module and said second clip member of said second clip lead terminal contacts to said second main surface of said board of said module, and said first and third clip members contacting to said first main surface of said board of said module.

2. An unit type clip lead terminal as claimed in claim 1, wherein said connecting portion is made of an insulating tape.

3. A unit type clip lead terminal, comprising:

a plurality of first clip lead terminals which contacts first main surface connecting terminals, each having at one end thereof clip portions to be electrically connected to said first main surface connecting terminals by sandwiching an end portion of a board of a module and said first main surface connecting terminals formed thereon between three-branched clip members of said clip portions, and having a lead portion at the other end thereof;

wherein the board has a first main surface and a second main surface opposite the first main surface and wherein the first main surface connecting terminals are formed on the first main surface;

a plurality of second clip lead terminals which contacts second main surface connecting terminals, each having at one end thereof clip portions to be electrically connected to said second main surface connecting terminals by sandwiching an end portion of said board and said second main surface connecting terminals formed thereon between three-branched clip members of said clip portions, and having a lead portion at the other end thereof;

wherein the second main surface connecting terminals are formed on the second main surface;

said lead portions of said first and second clip lead terminals being alternately arranged so as to be spaced apart from one another and in parallel with one another with leading edges of said respective clip portions aligned on a straight line;

each of said first clip lead terminals being fixed to a first main surface of a band-like insulating spacer having substantially the same thickness as said board; and each of said second clip lead terminals being fixed to a second main surface of said insulating spacer on the opposite side of said first main surface, wherein said three-branched clip members of said first and second clip lead terminals comprise first, second and third clip members spaced in parallel with one another, said second clip member being located between said first and third clip members, said second clip member of said first clip lead terminal and contacts to said first main surface of said board of said module, and said first and third clip members contacting to said second main surface of said board of said module and said second clip member of said second clip lead terminal contacts to said second main surface of said board of said module, and said first and third clip members contacting to said first main surface of said board of said module.

4. The unit type clip lead terminal according to claim 1, wherein each of the clip portions of said first and second clip lead terminals alternating positions of said three-branched clip members on said board such that adjacent clip-members are physically and electrically separated.

5. The unit type clip lead terminal according to claim 1, wherein an end of each of the lead portions of said first clip lead terminals is bent approximately 90 degrees to its respective end portion.

6. The unit type clip lead terminal according to claim 1, wherein said leading edges of the lead portions of said second clip lead terminals are connected to one another through a guide member.

7. The unit type clip lead terminal according to claim 1, wherein said connecting portion is formed by an insulating tape.

8. The unit type clip lead terminal according to claim 4, wherein said insulating tape is made of polymide.

9. The unit type clip lead terminal according to claim 4, wherein said insulating tape is made of Teflon.

10. The unit type clip lead terminal according to claim 3, wherein each of the clip portions of said first and second clip lead terminals alternating positions of said three-branched clip members on said board such that adjacent clip members are physically and electrically separated.

* * * * *